(12) United States Patent
Oh et al.

(10) Patent No.: US 10,133,138 B2
(45) Date of Patent: Nov. 20, 2018

(54) DISPLAY DEVICE

(71) Applicant: Samsung Display Co. Ltd., Yongin-si, Gyeonggi-do (KR)

(72) Inventors: Hwa Yeul Oh, Suwon-si (KR); Sung Man Kim, Seoul (KR); Min Chul Song, Suwon-si (KR); Seong Su Lim, Seoul (KR); Tae Hyung Hwang, Seoul (KR)

(73) Assignee: SAMSUNG DISPLAY CO., LTD. (KR)

( * ) Notice: Subject to any disclaimer, the term of this patent is extended or adjusted under 35 U.S.C. 154(b) by 55 days.

(21) Appl. No.: 15/245,008

(22) Filed: Aug. 23, 2016

(65) Prior Publication Data

US 2017/0115542 A1 Apr. 27, 2017

(30) Foreign Application Priority Data

Oct. 21, 2015 (KR) .................. 10-2015-0146619

(51) Int. Cl.
*G02F 1/1343* (2006.01)
*G02F 1/1362* (2006.01)
(Continued)

(52) U.S. Cl.
CPC ...... *G02F 1/136286* (2013.01); *G02F 1/1368* (2013.01); *G02F 1/133345* (2013.01); *G02F 1/134336* (2013.01); *H01L 27/124* (2013.01); *G02F 1/1337* (2013.01); *G02F 1/13439* (2013.01); *G02F 1/13458* (2013.01); *G02F 1/133305* (2013.01); *G02F 1/133512* (2013.01); *G02F 1/133514* (2013.01); *G02F 2001/133357* (2013.01); *G02F 2001/133519* (2013.01); *G02F 2001/136295* (2013.01); *G02F 2201/121* (2013.01); *G02F 2201/123* (2013.01); *G02F 2201/56* (2013.01); *G02F 2203/04* (2013.01);
(Continued)

(58) Field of Classification Search
CPC ............ G09G 2310/0281; G02F 2001/134372
See application file for complete search history.

(56) References Cited

U.S. PATENT DOCUMENTS 6,496,238 B1 12/2002 Greene et al.
2008/0284967 A1* 11/2008 Oh .................... G02F 1/134363
349/144

(Continued)

FOREIGN PATENT DOCUMENTS

| KR | 10-2013-0039584 A | 4/2013 |
| KR | 10-2014-0080670 A | 7/2014 |
| KR | 10-2015-0001432 A | 1/2015 |

*Primary Examiner* — Nathanael R Briggs
*Assistant Examiner* — Alexander Gross
(74) *Attorney, Agent, or Firm* — Innovation Counsel LLP

(57) ABSTRACT

A display device may include a pixel electrode, a transistor, a first gate line, a second gate line, and a third gate line. The transistor may be electrically connected to the pixel electrode. The first gate line may be electrically connected to the transistor. The second gate line may extend not parallel to the first gate line. The third gate line may overlap the pixel electrode and may extend not parallel to the first gate line. The second gate line or the third gate line may be electrically connected to the first gate line. The pixel electrode may be partially positioned between the second gate line and the third gate line in a plan view of the display device.

20 Claims, 12 Drawing Sheets

(51) Int. Cl.
    *G02F 1/1368*     (2006.01)
    *G02F 1/1333*     (2006.01)
    *H01L 27/12*     (2006.01)
    *G02F 1/1335*     (2006.01)
    *G02F 1/1337*     (2006.01)
    *G09G 3/36*     (2006.01)
    *G02F 1/1345*     (2006.01)

(52) U.S. Cl.
    CPC ... *G09G 3/3648* (2013.01); *G09G 2300/0426* (2013.01)

(56) References Cited

U.S. PATENT DOCUMENTS

| | | | |
|---|---|---|---|
| 2012/0127412 A1* | 5/2012 | Lee | G02F 1/1345 349/139 |
| 2014/0063390 A1* | 3/2014 | Yonekura | G02F 1/136286 349/39 |
| 2014/0167052 A1* | 6/2014 | Park | G02F 1/136286 257/59 |
| 2016/0019856 A1* | 1/2016 | Tanaka | G09G 3/3648 345/206 |

* cited by examiner

DISPLAY DEVICE

This application claims priority to Korean Patent Application No. 10-2015-0146619, filed on Oct. 21, 2015 in the Korean Intellectual Property Office; the Korean Patent Application is incorporated herein in its entirety by reference.

BACKGROUND

1. Field

The technical field relates to display device, e.g., a liquid crystal display device.

2. Description of the Related Art

A display device, such as a liquid crystal display device, may include a plurality of pixels for displaying an image, an array substrate provided with components for driving these pixels, and a backlight unit for supplying light to the array substrate. The components for driving the pixels may include a gate driving unit, a data driving unit, and the like.

The gate driving unit, the data driving unit, and the like may be disposed in a non-display area outside an image display area and may be covered by a bezel. The non-display area and/or the bezel may significantly and undesirably add to the size of the display device.

SUMMARY

An embodiment may be related to a display device, e.g., a liquid crystal display device, which may include a gate driving unit and a data driving unit. The gate driving unit and the data driving unit may be positioned at a same straight edge of the display device. A shape of the display device may not be substantially rectangular.

An embodiment may be related to a display device, such as a liquid crystal display device. The display device may include the following elements: a first substrate and a second substrate opposite each other; a pixel electrode disposed on the first substrate; a first gate line extending in a first direction and being positioned on the first substrate, a first insulating film disposed on the first gate line, wherein a first surface directly contacts the first gate line; a data line, a second gate line, and a third gate line extending in a second direction different from the first direction and directly contacting a second surface of the first insulating film. The pixel electrode includes a first domain portion and a second domain portion extending in two different directions. The second gate line is disposed along an edge of the pixel electrode. The third gate line overlaps a boundary between the first domain portion and the second domain portion. The first gate line is electrically connected to only one of the second gate line and the third gate line through a gate contact hole in the first insulating film.

An embodiment may be related to a display device, e.g., a liquid crystal display. The display device may include the following elements: a first substrate including a display area on which pixel electrodes are disposed and including a non-display area other than the display area; a first gate line extending in a first direction and being positioned on the display area; a first insulating film disposed on the gate line; and a data line, a second gate line, and a third gate line extending in a second direction different from the first direction. The first gate line is electrically connected to only one of the second gate line and the third gate line through a gate contact hole in the first insulating film. The non-display area may be positioned between two separate portions of the display area and may be wider than each of the pixel electrodes in the first direction.

An embodiment may be related to a display device. The display device may include a first pixel electrode, a first transistor, a first gate line, a second gate line, and a third gate line. The first transistor may be electrically connected to the first pixel electrode. The first gate line may be is electrically connected to a gate electrode of the first transistor. The second gate line may extend not parallel to the first gate line. The third gate line may overlap the first pixel electrode and may extend not parallel to the first gate line. The second gate line or the third gate line may be electrically connected to the first gate line. The first pixel electrode may be partially positioned between the second gate line and the third gate line in a plan view of the display device.

The third gate line may be straight and may cross the first gate line in the plan view of the display device. The second gate line may be straight, may be parallel to the third gate line, and may be perpendicular to the first gate line in the plan view of the display device.

The display device may include and insulating film and a data line. The insulating film may be positioned between the first gate line and the second gate line, may be positioned between the first gate line and the third gate line, and may have a first surface and a second surface opposite each other. The first surface of the insulating film may directly contact each of the second gate line and the third gate line. The second surface of the insulating film may directly contact the first gate line. The data line may be electrically connected to a source electrode of the first transistor, may directly contact the first surface of the insulating film, and may be formed of a conductive material. Each of the second gate line and the third gate line may be formed of the conductive material.

The second gate line may be electrically connected to the first gate line. The third gate line may be electrically insulated from the first gate line.

The first pixel electrode may include a first electrode portion and a second electrode portion. The first electrode portion may be positioned between the second gate line and the third gate line in the plan view of the display device. The third gate line may be positioned between the first electrode portion and the second electrode portion in the plan view of the display device. The first electrode portion may extend at an obtuse angle with respect to the second electrode portion.

The first electrode portion and the second electrode portion may be symmetrical to each other with reference to the third gate line in the plan view of the display device.

The display device may include a second pixel electrode, a second transistor, a fourth gate line, a fifth gate line, a sixth gate line, and a non-display area. The second transistor may be electrically connected to the second pixel electrode. The fourth gate line may be electrically connected to a gate electrode of the second transistor. The fifth gate line may extend not parallel to the fourth gate line. The sixth gate line may overlap the second pixel electrode and may extend not parallel to the fourth gate line. The fifth gate line or the sixth gate line may be electrically connected to the fourth gate line. The second pixel electrode may be partially positioned between the fifth gate line and the sixth gate line in the plan view of the display device. The non-display area may be positioned between the first pixel electrode and the second pixel electrode in the plan view of the display device and may be wider than each of the first pixel electrode and the second pixel electrode in a direction parallel to the first gate line.

The display device may include a substrate, which may overlap both the first pixel electrode and the second pixel electrode and may have two edges. The two edges of the substrate may be positioned between the first pixel electrode and the second pixel electrode in the plan view of the display device.

Each of the two edges of the substrate may be curved.

One of the two edges may extend at an acute angle with respect to another of the two edges in the plan view of the display device. A tangent to one of the two edges may extend at an acute angle with respect to a tangent to another of the two edges in the plan view of the display device.

The first gate line may be aligned with the fourth gate line and may be spaced from the fourth gate line. The two edges of the substrate may be positioned between the first gate line and the fourth gate line in the plan view of the display device. The non-display area may be positioned between the first gate line and the fourth gate line in the plan view of the display device.

The second gate line may be electrically insulated from the first gate line (e.g., GL1_B2 illustrated in FIG. 12). The third gate line (e.g., GL3_B2 illustrated in FIG. 12) may be electrically connected to the first gate line. The fifth gate line (e.g., GL2_C1 illustrated in FIG. 12) may be electrically connected to the fourth gate line e.g., GL1_C1 illustrated in FIG. 12). The sixth gate line may be electrically insulated from the fourth gate line. The third gate line and the sixth gate line may be positioned between the second gate line and the fifth gate line in the plan view of the display device.

The display device may include a second pixel electrode, a second transistor, and a fourth gate line. The second pixel electrode may overlap the third gate line. The second transistor may be electrically connected to the second pixel electrode. The fourth gate line may be electrically connected to a gate electrode of the second transistor, may be electrically insulated from the third gate line, and may extend parallel to and longer than the first gate line.

The display device may include a gate driving chip, which may be electrically connected through the second gate line or the third gate line to the first gate line. The first pixel electrode may be positioned between the first gate line and the gate driving chip in the plan view of the display device.

The display device may include a substrate, which may include a display area and a non-display area. The display area may overlap the first pixel electrode. A boundary between the display area and the non-display area may extend parallel to the first gate line and may be positioned between the first pixel electrode and the gate driving chip in the plan view of the display device.

The display device may include a data line and a data driving chip. The data line may be electrically connected to a source electrode of the first transistor. The data driving chip may be electrically connected to the data line. The first pixel electrode may be positioned between the first gate line and the data driving chip in the plan view of the display device. The boundary may be positioned between the first pixel electrode and each of the data driving chip and the gate driving chip in the plan view of the display device. The data driving chip may be aligned with the gate driving chip in a direction parallel to the first gate line.

The display device may include a second pixel electrode, a second transistor, a common voltage line, and a common electrode. The second transistor may be electrically connected to the second pixel electrode and may be electrically connected to the first gate line. The common voltage line may overlap the second pixel electrode. The common electrode may overlap both the first pixel electrode and the second pixel electrode and may extend through a contact hole to directly contact the common voltage line. The contact hole may be positioned at an intersection of the common voltage line and the first gate line in the plan view of the display device. The features can be appreciated from, for example, FIG. 8, FIG. 9, and related description.

The display device may include a second pixel electrode, a second transistor, a common voltage line, a common electrode, and an insulating film. The second transistor may be electrically connected to the second pixel electrode and may be electrically connected to the first gate line. The common voltage line may overlap the second pixel electrode. The common electrode may overlap both the first pixel electrode and the second pixel electrode and may extend through a contact hole to directly contact the common voltage line. The insulating film may be positioned between the first gate line and the second gate line, may be positioned between the first gate line and the third gate line, may be positioned between the first gate line and the common voltage line, and may have a first surface and a second surface opposite each other. The first surface of the first insulating film may directly contact each of the second gate line, the third gate line, and the common voltage line. The second surface of the first insulating film may directly contact the first gate line.

DETAILED DESCRIPTION OF THE EMBODIMENTS

Embodiments are described with reference to the accompanying drawings. Possible embodiments may be embodied in different forms and should not be construed as limited to the described embodiments. The same reference numbers may indicate the same components in the specification. In the attached figures, thicknesses of layers and regions may be exaggerated for clarity.

Although the terms first, second, third, etc., may be used herein to describe various elements, these elements should not be limited by these terms. These terms may be used to distinguish one element from another element. A first element discussed in this application could be termed a second element without departing from the teachings of this application. The terms "first", "second", etc. may also be used herein to differentiate different categories or sets of elements. For conciseness, the terms "first", "second", etc. may represent "first-category (or first-set)", "second-category (or second-set)", etc., respectively.

The terminology used herein is for the purpose of describing particular embodiments and is not intended to be limiting. As used herein, the singular forms "a," "an," and "the" may include the plural forms, including "at least one," unless the content clearly indicates otherwise. The term "and/or" may include any and all combinations of one or more of the associated items. The terms "comprises," "comprising," "includes," and/or "including" may specify the presence of stated features, regions, integers, steps, operations, elements, and/or components, but do not preclude the presence or addition of one or more other features, regions, integers, steps, operations, elements, components, and/or groups.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the term "below" can encompass both an orientation of above and below. The device may be otherwise oriented (rotated 90 degrees or at other orientations) and the spatially relative descriptors used herein interpreted accordingly.

Features described with reference to different figures may be combined.

Figure 1:
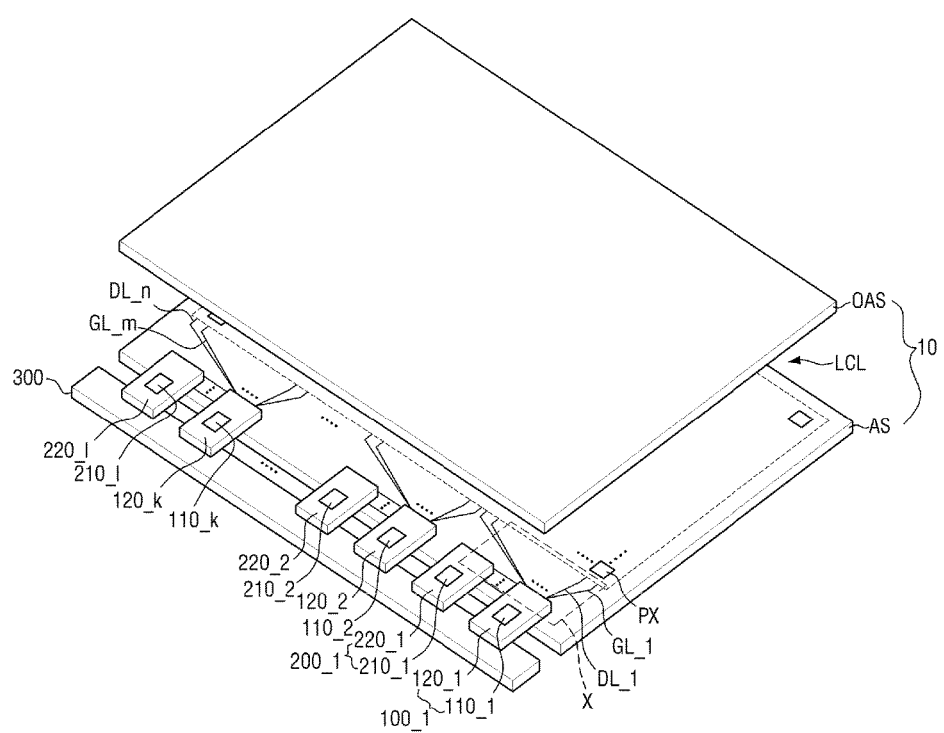
FIG. 1 is an exploded perspective view of a display device, e.g., a liquid crystal display device, according to an embodiment.

FIG. 1 is an exploded perspective view of a display device, e.g., a liquid crystal display device, according to an embodiment.

Referring to FIG. 1, the liquid crystal display according to the embodiment includes a display panel 10, data driving units including a data driving unit 200_1, and gate driving units including a gate driving unit 100_1.

The display panel 10 includes an array substrate AS including a plurality of pixels PX formed thereon, an opposite array substrate OAS disposed to face the array substrate AS, and a liquid crystal layer LCL interposed between the array substrate AS and the opposite array substrate OAS.

The array substrate AS may include a plurality of pixel electrodes (not shown) corresponding to pixels PX, and a plurality of transistors (not shown) connected to the corresponding pixel electrodes (not shown). The transistor (not shown) may receive a data signal through the corresponding data line DL in response to a gate signal transferred through the corresponding gate line GL. The received data signal may be provided to the pixel electrode (not shown) corresponding to the corresponding transistor TR (not shown).

The opposite array substrate OAS may be disposed to face the array substrate AS, absorb an impact applied to an upper portion of the array substrate AS to relax the impact, and protect constitution elements disposed on the array substrate AS. The opposite array substrate OAS may be formed to overlap most areas of the array substrate AS, but to overlap a part of the areas of the array substrate AS and have an area that is smaller than that of the array substrate AS. On the contrary, the opposite array substrate OAS may be formed to overlap all areas of the array substrate AS and have an area that is larger than that of the array substrate AS.

The data driving unit 200 may receive an image signal and a data control signal from a timing controller (not shown) mounted on a driving circuit substrate 300. The data driving unit 200 may generate an analogue data voltage corresponding to the image signal in response to the data control signal. The analogue data voltage may be the data signal. The data driving units may provide data signal to the pixels PX through the data line DL_1 to DL_n.

The gate driving unit 100_1 may generate a gate signal in response to a gate control signal provided from the timing controller (not shown). Gate signals may be sequentially provided in a row unit to a plurality of pixels PX through the gate line GL_1 to GL_m. Although not shown in the drawings, gate control signals may be provided through first flexible circuit substrates 120_1 to 120_k to a plurality of gate driving chips 110_1 to 110_k. The gate driving chips 110_1 to 110_k may be mounted on the corresponding first flexible circuit substrates 120_1 to 120_k to be connected to gate pads GP of a non-display area NDA using an anisotropic conductive film. The non-display area NDA may mean an area other than a display area DA on the array substrate AS, and the display area DA may mean an area including the pixels PX disposed in a matrix form to display an image in practice.

The data driving units may include a plurality of data driving chips 210_1 to 210_1. The data driving chips 210_1 to 210_1 may be mounted on the corresponding second flexible circuit substrates 220_1 to 220_1 to be connected to data pads DP of the driving circuit substrate and the non-display area NDA. Although not shown in the drawings, the flexible circuit substrate on which the data driving chips are mounted may be connected to the corresponding data pad DP using an anisotropic conductive film.

In an embodiment, the gate driving chips 110_1 to 110_k and the data driving chips 210_1 to 210_1 are mounted on the first flexible circuit substrates 120_1 to 120_k and the second flexible circuit substrates 220_1 to 220_1 using a tape carrier package (TCP) method as an example, but the method is not limited thereto, and mounting may be performed in the non-display area NDA using a chip on glass (COG) method. Further, the gate driving unit 100 may be formed using an amorphous silicon gate (ASG) method of integrally forming the gate driving unit 100 in the non-display area NDA on the array substrate AS.

In an embodiment, the array substrate AS may have a rectangle shape having four edges, and the gate driving unit 100 and the data driving unit 200 may be disposed only along any one edge of the four edges of the array substrate AS. In connection therewith, the gate driving unit 100 and the data driving unit 200 may not be disposed at three remaining edges. Accordingly, a distance between an external side of the display area DA and an external side of the array substrate AS may be short at the three edges at which the gate driving unit 100 and the data driving unit 200 are not disposed, thus allowing a bezel to have a small thickness.

A disposal structure of the gate driving unit 100 and the data driving unit 200 will be then described.

Figure 2:
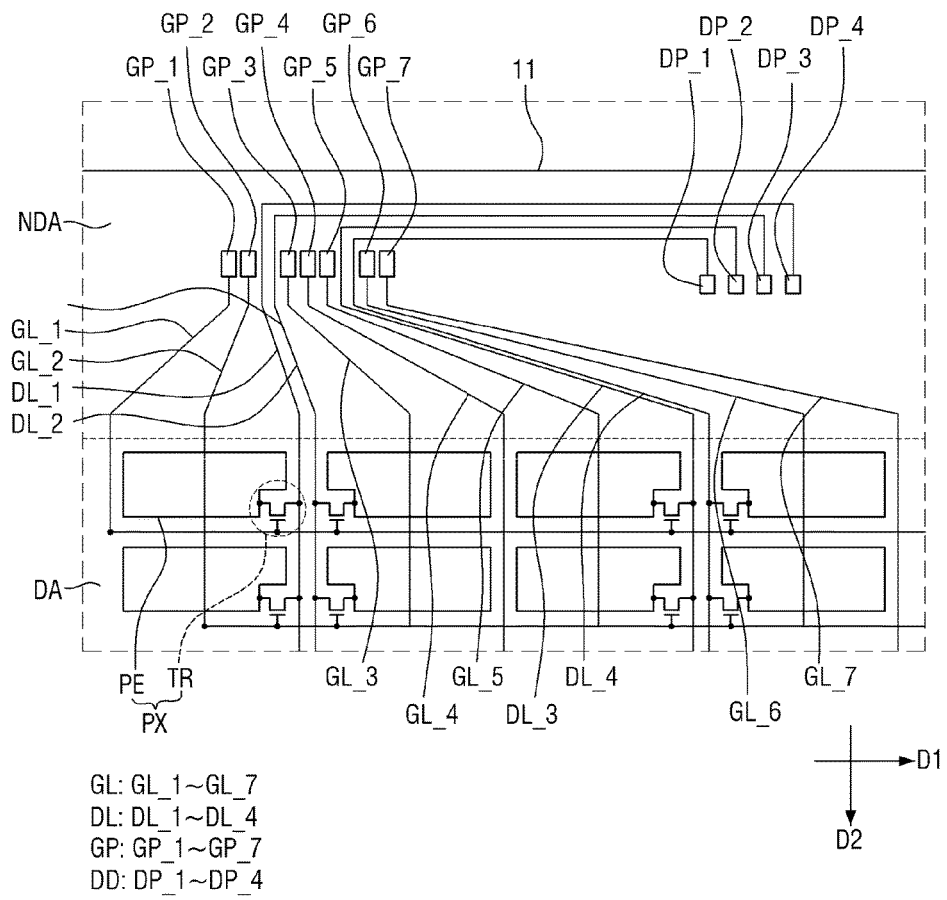
FIG. 2 is a plan view of an area of FIG. 1 according to an embodiment.
Figure 3:
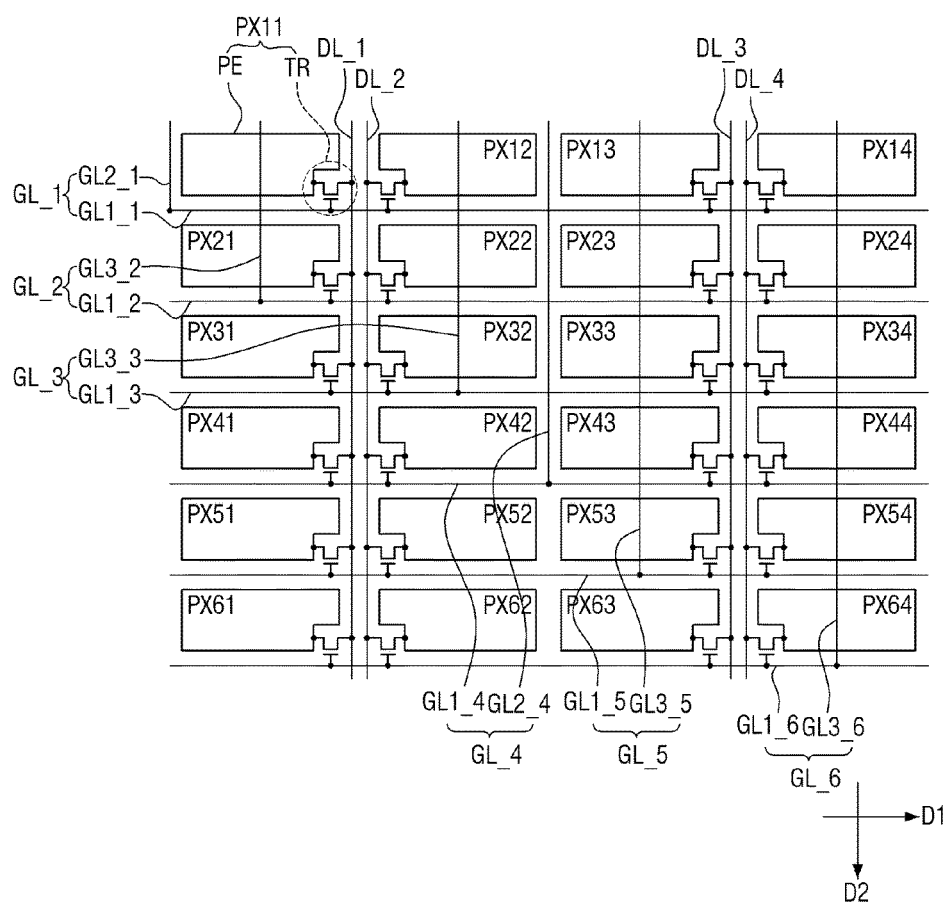
FIG. 3 is a layout view (or plan view) showing some pixel electrodes, gate lines, data lines shown in FIG. 2 according to an embodiment.

FIG. 2 is a plan view showing an area X of FIG. 1 according to an embodiment, and FIG. 3 is a layout view (or plan view) showing some pixel electrodes, gate lines, and data lines illustrated in FIG. 2 according to an embodiment.

FIG. 2 shows a structure other than the first flexible circuit substrates 120_1 to 120_k and the second flexible circuit substrates 220_1 to 220_1 in the X area of FIG. 1, and FIG.

3 shows twenty four pixels PX including four pixels PX in a first direction D1 and six pixels PX in a second direction D2.

Referring to FIGS. 2 and 3, pixels PX, gate lines GL, data lines DL, gate pads GP, and data pads DP are disposed on the array substrate AS.

The pixel PX is disposed in the display area DA, and includes the pixel electrode PE and the transistor TR connected to the corresponding pixel electrode PE. The pixel electrode PE may form an electric field according to the data signal transferred through the transistor TR, and arrangement of liquid crystal molecules LC of a liquid crystal layer LCL disposed to overlap the corresponding pixel electrode PE may be controlled using the electric field, thus displaying an image. The pixel PX may be connected to one data line DL and one gate line GL through the transistor TR.

The gate lines GL may include the following: first-type gate lines (or first gate lines GL1) including GL1_1, GL1_2, and GL1_3; second-type gate lines (or second gate lines GL2) including GL2_1; and third-type gate lines (or third gate lines GL3) including GL3_2 and GL3_3. The first gate lines GL1 may be disposed only in the display area DA, and both the second gate lines GL2 and the third gate lines GL3 may be disposed in both the display area DA and the non-display area NDA.

The first gate line GL1 extends in the first direction D1. The first direction D1 corresponds to a direction extending to be parallel to a side of the array substrate AS, and as shown in FIG. 2, may be defined as a direction indicated by a predetermined straight line extending from a left side to a right side. However, the first direction is not limited thereto, and may not be parallel to the side of the array substrate AS. That is, the first direction D1 may be a direction indicated by a straight line extending in a predetermined direction on the array substrate AS. In an embodiment, the first gate line GL1 is exemplified to extend in a direction from a left side to a right side, that is, a horizontal direction.

The first gate line GL1 may be connected to the transistor TR disposed to be adjacent to the first gate line GL1. Accordingly, the gate signal provided to the first gate line GL1 may be provided to the pixel PX connected to the first gate line GL1 through the first gate line GL1.

The second gate line GL2 and the third gate line GL3 extend in a predetermined direction in the display area DA. That is, the second gate line GL2 and the third gate line GL3 disposed in the display area DA extend in the second direction D2. The second direction D2 means a direction crossing the first direction D1, and may be an extension direction of a predetermined straight line forming a predetermined included angle together with a predetermined straight line extending in the first direction D1. An embodiment shows that a predetermined straight line extending in the first direction D1 and a predetermined straight line extending in the second direction D2 are perpendicular to each other, and the straight lines may have the included angle of 90°. That is, in an embodiment, the second direction D2 may be a direction indicated by a predetermined straight line extending from an upper side to a lower side.

The second gate line GL2 and the third gate line GL3 may be connected to the first gate line GL1. Specifically, the one second gate line GL2 or the one third gate line GL3 may be connected to the one first gate line GL1. Accordingly, when the gate signal is provided to the second gate line GL2 or the third gate line GL3, the gate signal may be provided to the first gate line GL1 through the second gate line GL2 or the third gate line GL3.

The second gate line GL2 and the third gate line GL3 are discriminated from each other according to a position. That is, roles of the second gate line GL2 and the third gate line GL3 may be the same in that the gate signal is provided to the first gate line GL1, but are different in that the second gate line GL2 is disposed along a boundary of the pixels PX adjacent in the first direction D1 and the third gate line GL3 is disposed to overlap the pixel PX.

Moreover, the third gate line GL3 is disposed to overlap a boundary between immediately adjacent pixels PX.

The second gate line GL2 and the third gate line GL3 disposed in the non-display area NDA are connected to the gate pads GP. That is, the second gate line GL2 and the third gate line GL3 may extend in the second direction D2 in the display area DA, but may extend in an optimum direction to be connected to the gate pads GP in the non-display area NDA. As described above, the gate pads GP may be connected to the first flexible circuit substrates 120_1 to 120_$k$ on which the gate driving chips 110_1 to 110_$k$ are disposed. Accordingly, the gate signal provided from the gate driving chips 110_1 to 110_$k$ may be provided to the gate pads GP through the first flexible circuit substrates 120_1 to 120_$k$, to the second gate line GL2 or the third gate line GL3 through the gate pads GP, to the first gate line GL1 through the second gate line GL2 or the third gate line GL3, and to the transistor TR through the first gate line GL1. Whether the transistor TR disposed in the display area DA is ON or OFF may be controlled using the gate signal.

The data line DL is disposed in the display area DA and the non-display area NDA. The data line DL may extend in the second direction D2 in the display area DA. That is, the data line DL may be disposed to be parallel to the second gate line GL2 or the third gate line GL3 disposed in the display area DA.

The data line DL of the non-display area NDA is connected to the data pad DP. That is, the data line DL may extend in the second direction D2 in the display area DA, but may extend in an optimum direction to be connected to the data pad DP in the non-display area NDA. As described above, the data pads DP may be connected to the second flexible circuit substrates 220_1 to 220_1 on which the data driving chips 210_1 to 210_1 are disposed. Accordingly, the data signal provided from the data driving chips 210_1 to 210_1 may be provided to the data pad DP through the second flexible circuit substrates 210_1 to 210_1, to the data line DL through the data pad DP, and to the transistor TR through the data line DL. The data signal provided to the transistor TR may be provided to the pixel electrode PE in response to whether the transistor TR is ON or OFF, and the pixel electrode PE may form an electric field corresponding to the data signal.

The first gate line GL1 may be disposed to overlap the data line DL, but the second gate line GL2, the third gate line GL3, and the data line DL are disposed to be prevented from overlapping each other. The reason is that the second gate line GL2, the third gate line GL3, and the data line DL may be made of the same material on the same layer.

The gate pads GP may be connected in a plurality of units to the first flexible circuit substrates 120_1 to 120_$k$. Further, the data pads DP may be connected in a plurality of units to the second flexible circuit substrates 220_1 to 220_1. In an embodiment, for example, it is assumed that the seven gate pads GP_1 to GP_7 are connected to the one first flexible circuit substrate and the four data pads DP1 to DP4 are connected to the one second flexible circuit substrate. As shown in FIG. 1, the first flexible circuit substrate and the second flexible circuit substrate are disposed to be prevented from overlapping each other, and accordingly, the seven gate pads GP1 to GP7 and the four data pads DP1 to DP4 may be disposed to be spaced apart from each other at predetermined intervals.

The four data lines DL may be disposed between the second gate lines GL2 and the third gate lines GL3 in the total number of seven. The reason is that the second gate lines GL2 and the third gate lines GL3 in the total number of seven cannot be disposed to be continuously adjacent to each other for the purpose of connection to the pixel PX. Therefore, as shown in FIG. 2, in the non-display area NDA, the data line DL may be longer than the second gate line GL2 and the third gate line GL3, and the gate pad GP and the data pad DP may be spaced apart from each other at predetermined intervals. However, disposal of the second gate line GL2, the third gate line GL3, and the data line DL in the non-display area NDA is not limited thereto, and any disposal may be allowed as long as the second gate line GL2, the third gate line GL3, and the data line DL are connected to the first flexible circuit substrate and the second flexible circuit substrate.

FIG. 3 shows disposal of the four pixels PX in the first direction D1 and the six pixels PX in the second direction D2 in a matrix form. That is, the pixels PX are disposed over six rows and four columns. The number of data lines DL connected to the pixels PX needs to be four that is the number of columns of the pixels PX, and the number of first gate lines GL1 connected to the pixels PX needs to be six that is the number of rows of the pixels PX. The first direction D1 may correspond to a row direction that is an extension direction from an upper side to a lower side, and the second direction D2 may correspond to a column direction that is an extension direction from a left side to a right side.

Each of the second gate line GL2 and the third gate line GL3 corresponds to the first gate line GL1, accordingly, the total number of the second gate lines GL2 and the third gate lines GL3 needs to be six. Therefore, the four data lines DL and the six second gate lines GL2 or third gate lines GL3 are required to drive the twenty four pixels PX disposed over the six rows and the four columns, accordingly, the total number of lines extending in the second direction D2 needs to be 10.

Among the ten lines, since a part of the lines is disposed in pairs between the pixels PX, another line is disposed alone between the pixels PX, and the residual lines are disposed to overlap the pixels PX.

Specifically, for disposal of the ten lines from the left side to the right side, a primary second gate line GL2_1 may be disposed on the left side of pixels PX11 to PX61 disposed on a first column. A secondary third gate line GL3_2 may be disposed to overlap the pixels PX11 to PX61 disposed on the first column. First and second data lines DL1 and DL2 may be disposed between the pixels PX11 to PX61 disposed on the first column and pixels PX12 to PX62 disposed on a second column. A tertiary third gate line GL3_3 may be disposed to overlap the pixels PX12 to PX62 disposed on the second column. A quaternary second gate line GL2_4 may be disposed between the pixels PX12 to PX62 disposed on the second column and pixels PX13 to PX63 disposed on a third column. A third data line DL_3 and a fourth data line DL_4 may be disposed between the pixels PX13 to PX63 disposed on the third column and pixels PX14 to PX64 disposed on a fourth column. A senary third gate line GL26 may be disposed to overlap the pixels PX14 to PX64 disposed on the fourth column.

In an embodiment, all of the pixels PX11 to PX64 disposed on the four columns are described, but the pixels PX on the two columns may be repeated as a minimum unit. That is, for the line disposed in the second direction D2, based on the pixels PX on the two columns, the primary second gate line GL2_1 may be disposed on the left side of the pixel PX on the first column, the secondary third gate line GL3_2 may be disposed to overlap the pixel PX on the first column, the first and second data lines DL_1 and DL_2 may be disposed between the pixel PX on the first column and the pixel PX on the second column, and the tertiary third gate line GL3_3 may be disposed to overlap the pixel PX on the second column. Therefore, the line disposed in the second direction D2 may have a rule of repetition in a unit of the pixels PX on the two columns, and the maximum total number of data lines DL, second gate lines GL2, and third gate lines GL3 disposed in the second direction may be 2.5 times as large as the number of columns on which the pixels PX are disposed.

Even though the number of second gate lines GL2, third gate lines GL3, and data lines DL extending in the second direction D2 is larger than that of columns on which the pixels PX are disposed, the second gate lines GL2, the third gate lines GL3, and the data lines DL may be sufficiently disposed through the aforementioned disposal structure.

Hereinafter, actual structures of the first gate line GL1, the second gate line GL2, the third gate line GL3, the data line DL, and the pixels PX will be specifically described.

Figure 4:
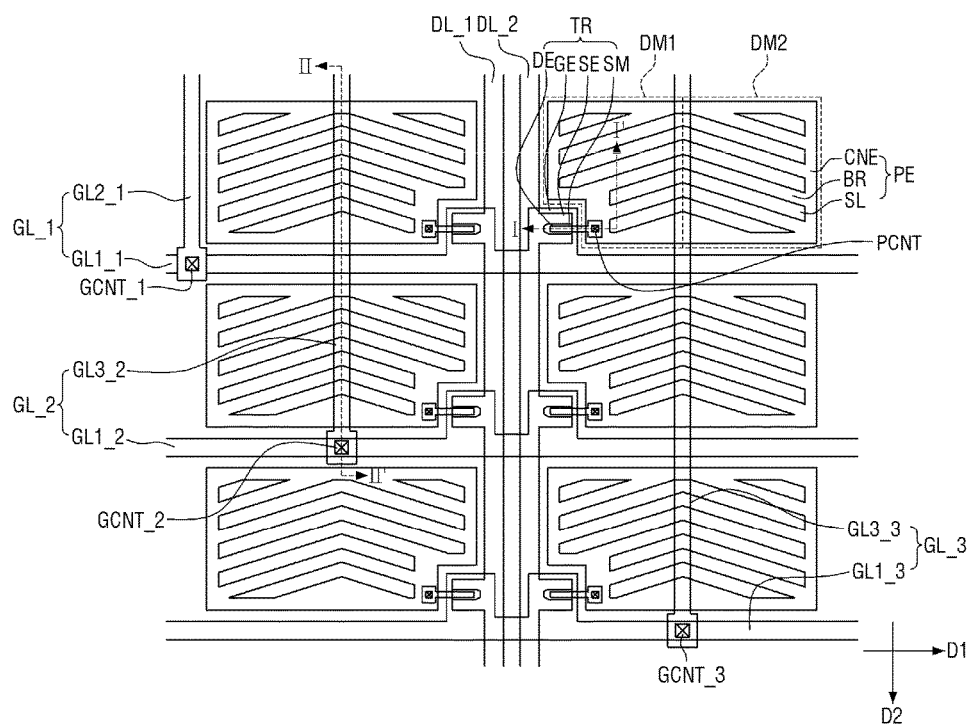
FIG. 4 is a layout view (or plan view) showing several pixels of a display panel according to an embodiment.
Figure 5:
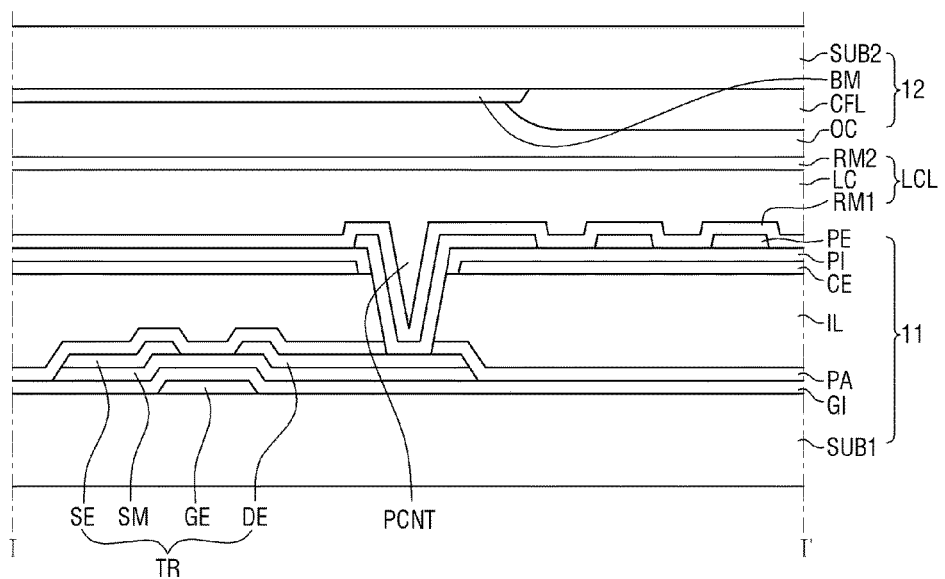
FIG. 5 is a cross-sectional view taken along the line I-I' of FIG. 4 according to an embodiment.
Figure 6:
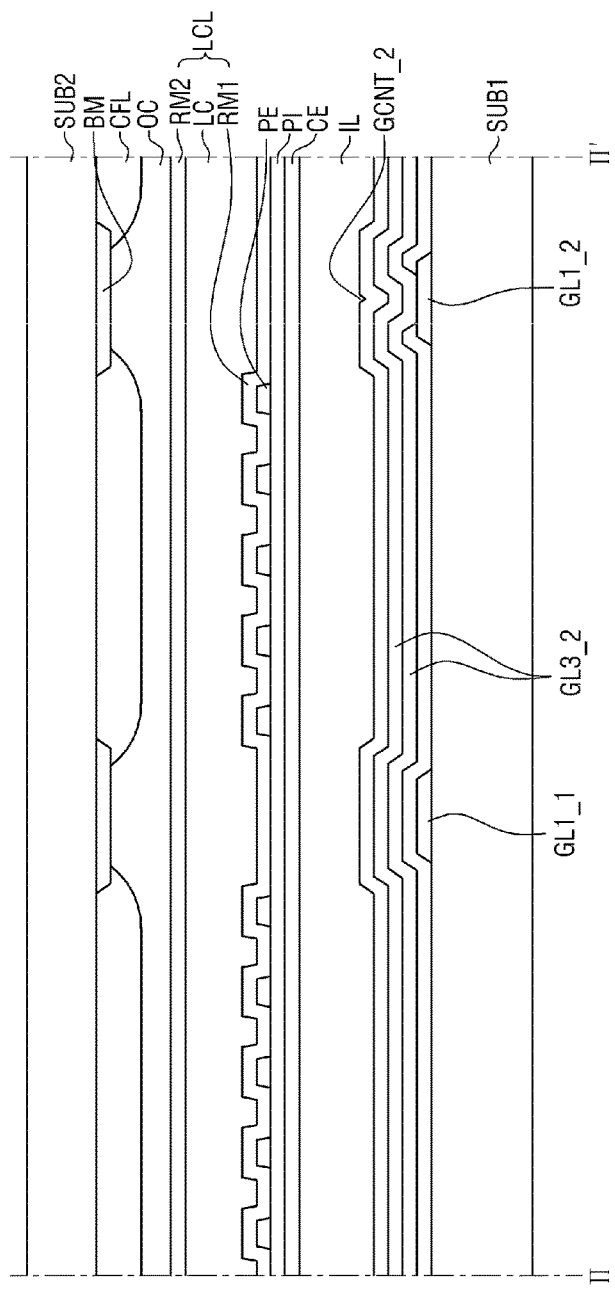
FIG. 6 is a cross-sectional view taken along the line II-II' of FIG. 4 according to an embodiment.

FIG. 4 is a layout view (or plan view) showing the pixels of a display panel according to an embodiment. FIG. 5 is a cross-sectional view taken along line I-I' of FIG. 4 according to an embodiment. FIG. 6 is a cross-sectional view taken along line II-II' of FIG. 4 according to an embodiment.

Referring to FIGS. 4 to 6, the display panel 10 according to the embodiment includes the array substrate AS, the opposite array substrate OAS, and the liquid crystal layer LCL.

In the array substrate AS, the transistors TR are formed to control the liquid crystal molecules LC of the liquid crystal layer LCL, and the opposite array substrate OAS is disposed to face the array substrate AS.

Hereinafter, the array substrate AS will be described.

The array substrate AS includes a first base substrate SUB1. The first base substrate SUB1 may be a transparent insulating substrate. For example, the first base substrate SUB1 may include a glass substrate, a quartz substrate, or a transparent resin substrate. Further, the first base substrate SUB1 may include a polymer or plastic having high heat resistance. The first base substrate SUB1 may have a flat surface, but be curved in a predetermined direction. The first base substrate SUB1 may have a rectangle shape having four sides on a plan view, but another polygonal structure, a circular structure, or a polygonal structure including curved sides.

The first base substrate SUB1 may be a flexible substrate. That is, the first base substrate SUB1 may be a substrate that is capable of being modified in shape using rolling, folding, or bending.

The first gate line GL1 and a gate electrode GE are disposed on the first base substrate SUB1. As described above, the first gate line GL1 may extend in the first direction D1.

The gate electrode GE may be formed to protrude from the first gate line GL1, and a constitution element forming the transistor TR.

The first gate line GL1 and the gate electrode GE may have a single layer structure, or a multilayered structure including at least two conductive films having different physical properties. Among the conductive films, the one conductive film may include low resistance metal, for example, aluminum-based metal, silver-based metal, or copper-based metal, to prevent signal delaying or a voltage drop of the first gate line GL1 and the gate electrode GE. On the contrary, another conductive film may include another material, particularly, a material having an excellent contact property with ITO (indium tin oxide) and IZO (indium zinc oxide), for example, molybdenum-based metal, chromium, titanium, or tantalum. Examples of the combination may include a chromium lower film and an aluminum upper film, and an aluminum lower film and a molybdenum upper film. However, embodiments are not limited thereto, and the first gate line GL1 and the gate electrode GE may include various metals and conductors.

A gate insulating film GI is disposed on the first gate line GL1 and the gate electrode GE. Constitution elements such as the first gate line GL1 and the gate electrode GE disposed beneath the gate insulating film GI, and other constitution elements disposed on the gate insulating film GI may be insulated from each other using the gate insulating film GI. That is, the gate insulating film GI may include an insulating material. For example, the gate insulating film GI may include silicon nitride, silicon oxide, silicon oxynitride, or a high dielectric material. The gate insulating film GI may have a single layer structure, or a multilayered structure including two insulating layers having different physical properties.

A semiconductor layer SM is disposed on the gate insulating film GI. The semiconductor layer SM may be disposed to overlap at least a part of the gate electrode GE. The semiconductor layer SM may include amorphous silicon, polycrystalline silicon, or oxide semiconductors.

Although not shown in the drawings, an ohmic contact member may be further disposed on the semiconductor layer SM. The ohmic contact member may include n+ hydrogenated amorphous silicon doped with an n-type impurity at a high concentration, or silicide. The ohmic contact members (not shown) may be disposed in pairs on the semiconductor layer SM. However, when the semiconductor layer SM is the oxide semiconductor, the ohmic contact member (not shown) may be omitted.

The second gate line GL2, the third gate line GL3, the data line DL, the source electrode SE, and the drain electrode DE are disposed on the semiconductor layer SM and the gate insulating film GI.

As described above, the second gate line GL2 and the third gate line GL3 extend in the second direction D2. The second gate line GL2 and the third gate line GL3 may be disposed to cross the first gate line GL1, and the one second gate line GL2 or the one third gate line GL3 may correspond to the one first gate line GL1 to be connected. The first gate line GL1 may be connected to the second gate line GL2 or the third gate line GL3 through a gate contact hole GCNT. The gate contact hole GCNT may be formed through the gate insulating film GI.

Therefore, the gate signal provided to the second gate line GL2 or the third gate line GL3 may be provided to the first gate line GL1 through the gate contact hole GCNT.

The data line DL extends in the second direction D2. The data line DL may be insulated from the first gate line GL1 using the gate insulating film GI. Further, the data line DL may be disposed to be prevented from crossing the second gate line GL2 and the third gate line GL3. The data line DL, the second gate line GL2, and the third gate line GL3 may be made of the same material on the same layer.

The data signal inputted from the outside may be provided to the source electrode SE using the data line DL. The data signal may have a changeable voltage value provided from the outside, and the contrast of the pixel PX may be controlled in response to the data signal.

The source electrode SE may be branched from the data line DL to protrude. Further, the source electrode SE may receive the data signal from the data line DL.

The drain electrode DE may be formed to be spaced apart from the source electrode SE. As shown in the drawings, the source electrode SE may be formed to surround the drain electrode DE in a 'U' shape. However, the shape of the source electrode SE and the drain electrode DE is not limited thereto, and an edge of the source electrode SE and an edge of the drain electrode DE may be disposed to be spaced apart from each other at predetermined intervals and thus be parallel to each other.

The semiconductor layer SM may be disposed in an area formed between the drain electrode DE and the source electrode SE spaced apart from each other. That is, the source electrode SE and the data line DL may partially overlap the semiconductor layer SM or come into contact with the semiconductor layer SM, and be disposed to face each other while the semiconductor layer SM is interposed therebetween. However, the semiconductor layer SM may be disposed in the area between the source electrode SE and the drain electrode DE, and also disposed to overlap the second gate line GL2, the third gate line GL3, and the data line DL. The aforementioned disposal is provided to minimize a costly mask process.

The second gate line GL2, the third gate line GL3, the data line DL, the source electrode SE, and the drain electrode DE may be made of aluminum, copper, silver, molybdenum, chromium, titanium, tantalum, or an alloy thereof, and may have a multilayered structure including a lower film (not shown) made of a refractory metal and a low resistance upper film (not shown) formed on the lower film.

The gate electrode GE, the source electrode SE, and the drain electrode DE form one transistor TR together with the semiconductor layer SM disposed between the gate electrode GE and the source electrode SE. The transistor TR may be a thin film transistor.

The transistor TR electrically connects the source electrode SE and the drain electrode DE in response to the voltage of the gate signal provided to the gate electrode GE. Specifically, when the voltage of the gate signal provided to the gate electrode GE corresponds to a voltage for turning off the transistor TR, the source electrode SE and the drain electrode DE are not electrically connected. In contrast, when the voltage of the gate signal provided to the gate electrode GE corresponds to a voltage for turning on the transistor TR, the source electrode SE and the drain electrode DE are electrically connected through a channel formed in the semiconductor layer SM.

The channel may be formed around the areas between the source electrode SE and the drain electrode DE in the semiconductor layer SM. That is, when the transistor TR is ON, the channel is formed around the areas between the source electrode SE and the drain electrode DE in the semiconductor layer SM, a voltage is transmitted along the channel, and electric current flows through the channel.

Consequently, the data signal provided to the data line DL can be provided to other components, not the semiconductor layer SM connected to the drain electrode DE, and whether or not the data signal is transmitted can be controlled by the gate signal provided to the first gate line GL1, the second gate line GL2, and the third gate line GL3.

A passivation film PA is disposed on the second gate line GL2, the third gate line GL3, the data line DL, the source electrode SE, the drain electrode DE, and the semiconductor layer SM. The passivation film PA may be made of an inorganic insulating material, and can cover and protect the data line DL and the transistor TR disposed therebeneath.

A planarization film IL is disposed on the passivation film PA. The planarization film IL can planarize the upper portion of the passivation film Pa in which unevenness is caused by the first gate line GL1, the second gate line GL2, the third gate line GL3, the data line DL, and the transistor TR. The planarization film IL may be made of an organic material. For example, the planarization film IL may be made of a photosensitive organic composition. However, the planarization film IL may also be omitted. A pixel contact hole for exposing a part of the transistor, more specifically, a part of the drain electrode DE may be formed in the planarization film IL and the passivation film PA. The pixel contact hole may be formed to vertically penetrate the planarization film IL and the passivation film PA. Therefore, the pixel contact hole may be formed to expose a part of the drain electrode DE and overlap a part of the drain electrode DE. The pixel contact hole may be formed with respect to each pixel.

A common electrode CE is disposed on the planarization film IL. The common electrode CE may be formed in an area other than an area in which the pixel contact hole is formed and an area adjacent to the area in the shape of a sheet. The common electrode CE may be made of a transparent conductive material, such as ITO, IZO, ITZO, or AZO. A common voltage is applied to the common electrode CE to form an electric field in the liquid crystal layer LCL together with the following pixel electrode PE.

A pixel insulating film PI is disposed on the common electrode CE. The pixel insulating film PI may be made of an inorganic insulating material. The pixel insulating film PI serves to insulate the common electrode CE formed thereebeneath and the pixel electrode formed thereon. Therefore, an electric field may be formed by the difference in voltage applied to the common electrode CE and the pixel electrode PE.

The pixel electrode PE is disposed on the pixel insulating film PI. A part of the pixel electrode PE is physically connected with the drain electrode DE through the contact hole to receive a data signal from the drain electrode DE. The pixel electrode PE may be made of a transparent conductive material, such as ITO, IZO, ITZO, or AZO. The pixel electrode PE may be formed to be divided into each pixel unit, unlike the common electrode CE which is formed in one plane without distinction between pixels PX.

The pixel electrode PE includes a plurality of branch electrodes BR and a plurality of connection electrodes CNE connecting the plurality of branch electrodes. The branch electrodes BR extend in a direction similar to the first direction D1. Here, the "direction similar to the first direction D1" means that the direction of any straight line connecting one end of the branch electrode BR and the other end thereof is the first direction D1.

The branch electrodes BR are spaced apart from each other at predetermined intervals to be disposed in parallel to each other. A slit SL, which is an opening not filled with a transparent conductive material, is formed between the branch electrodes. Therefore, an electric field having a specific orientation can be formed by the interaction of the branch electrodes BR, the slit SL, and the common electrode CE disposed thereunder, and liquid crystal molecules LC of the liquid crystal layer LCL can be controlled by the electric field.

The plurality of connection electrodes CNE may extend in the second direction D2 or in a direction similar to the second direction D2, and may be electrically and/or directly connected to the plurality of branch electrodes BR. Therefore, when a voltage is applied to any one of the plurality of branch electrodes BR and the plurality of connection electrodes CNE, the voltage can be transmitted to all of the branch electrodes BR and the connection electrodes CNE in the corresponding pixel PX.

The pixel electrode PE may include two domains, that is, a first domain DM1 and a second domain DM2 (or two portions corresponding to two domains). Here, the domain refers to an area in which liquid crystal molecules LC having a similar average alignment direction are disposed when an electric filed is applied to the liquid crystal layer LCL. The "liquid crystal molecules LC having a similar average alignment direction" means that the difference in alignment direction between the liquid crystal molecules LC is 45° or less when an electric filed is applied to the liquid crystal layer LCL. The first domain DM1 and the second domain DM2 may be formed from the difference in gradient between the branch electrode BR and the slit SL with respect to each area. That is, the average of angles between the branch electrodes BR and slits SL disposed in the first domain DM1 and any straight line extending in the first direction DM1 may be different from the average of angles between the branch electrodes BR and slits SL disposed in the second domain DM2 and any straight line extending in the first direction DM1. The difference between these angles may be 30° or more.

It is shown in the embodiment of FIG. 4 that the first domain DM1 is located at the left side of the pixel electrode PE, and the second domain DM2 is located at the left side of the pixel electrode PE. Further, as shown in FIG. 4, the gradient of the branch electrode BR and the slit SL may be greatly changed at the boundary at which the first domain DM1 and the second domain DM2 are adjacent to each other. Therefore, at the boundary at which the first domain DM1 and the second domain DM2 are adjacent to each other, liquid crystal molecules LC are influenced by the branch electrodes BR and slits SL disposed in the first domain DM1 and the second domain DM2, and thus texture, which a phenomenon in which darkness is visually recognized, may occur.

The third gate line GL3 may be disposed to overlap the boundary at which the first domain DM1 and the second domain DM2 are adjacent to each other. The boundary, at which the first domain DM1 and the second domain DM2 are adjacent to each other, is formed along the second direction D2, and the third gate line GL3 also extends along the second direction D2, so the boundary may be matched with the third gate line GL3. Consequently, the third gate line GL3 cannot transmit light because it is made of an opaque metal, and the boundary, at which the first domain DM1 and the second domain DM2 are adjacent to each other, also cannot transmit light because texture occurs at the boundary. Therefore, when the boundary and the third gate line GL3 are disposed to overlap each other, the third gate line GL3 can be disposed while minimizing the decrease in transmittance of the liquid crystal display.

Hereinafter, the opposite assay substrate (OAS) will be described.

The opposite assay substrate (OAS) includes a second base substrate SUB2, a light blocking member BM, a color filter layer (CFL), and overcoat layer (OC).

The second base substrate SUB2 is disposed to face the first base plate SUB 1. The second base substrate SUB2 may have durability to withstand external impact. The second base substrate SUB2 may be a transparent insulating substrate. For example, the second base substrate SUB2 may be a glass substrate, a quartz substrate, or a transparent resin substrate. Further, the second base substrate SUB2 may contain a polymer or plastic having high heat resistance. The second base substrate SUB2 may be flat, but may be curved in a predetermined direction. The second base substrate SUB2 may have flexibility. That is, the second base substrate SUB2 may be a substrate that can be changed in shape by rolling folding or bending.

The light blocking member BM is disposed on the second base substrate SUB2 (disposed beneath the second base substrate SUB2 in the drawing). The light blocking member BM may be disposed to overlap the transistor TR, data line DL, and first gate line GL1 of each pixel PX. The light blocking member BM can prevent a phenomenon in which images are visually recognized by a user due to the reflection of light to the transistor TR, data line DL, first gate line GL1, and other components of each pixel PX, and can inhibit the light leakage caused by the misalignment of liquid crystal molecules LC.

The color filter layer CFL is disposed on the light blocking member BM (disposed beneath the light blocking member BM in the drawing). The color filter layer CFL includes a plurality of patterned color filters. Each of the color filters transmits a specific wavelength band component of light incident from the outside of the first base substrate SUB1, and blocks other wavelength band components thereof, so as to allow the light emitted to the outside of the second base substrate SUB2 to have a specific color.

For example, the red color filter, which is a color filter allowing a user to be visually recognized in a red color, transmits the light in a wavelength band of about 580 nm to 780 nm, and absorbs (and/or reflects) the light in other wavelength bands. The green color filter, which is a color filter allowing a user to be visually recognized in a green color, transmits the light in a wavelength band of about 450 nm to 650 nm, and absorbs the light in other wavelength bands. The blue color filter, which is a color filter allowing a user to be visually recognized in a blue color, transmits the light in a wavelength band of about 380 nm to 560 nm, and absorbs the light in other wavelength bands. The red color filter may be made of a pigment or photosensitive organic material representing a red color, the green color filter may be made of a pigment or photosensitive organic material representing a green color, and the blue color filter may be made of a pigment or photosensitive organic material representing a blue color.

In an embodiment, the color filter layer CFL is disposed adjacent to the opposite array substrate OAS. However, embodiments are not limited thereto. That is, the color filter layer CFL may also be disposed adjacent to the array substrate AS. In this case, the color filter layer CFL may be disposed on the passivation film PA.

The overcoat layer OC is disposed on the light blocking member BM and the color filter layer CFL (disposed beneath the light blocking member BM and the color filter layer CFL in the drawing). The overcoat layer OC serves to protect the light blocking member BM and the color filter layer CFL and planarize the unevenness caused by these components. However, the overcoat layer OC may also be omitted depending on the shape and material of the light blocking member BM and the color filter layer CFL.

Hereinafter, a liquid crystal layer (LCL) will be described.

The liquid crystal layer (LCL) includes a plurality of liquid crystal molecules LC having dielectric anisotropy.

The liquid crystal molecules LC may be horizontally-aligned liquid crystal molecules LC horizontally arranged between the array substrate AS and the opposite array substrate OAS. When an electric field is formed between the array substrate AS and the opposite array substrate OAS, the liquid crystal molecules LC rotates in a predetermined direction between the array substrate AS and the opposite array substrate OAS, thereby changing the polarization state of the light transmitting the liquid crystal layer LCL. Each pixel PX can transmit or block the light depending on the change of polarization state occurring in the liquid crystal layer LCL.

The liquid crystal layer LCL may further include an upper alignment layer RM2 and a lower alignment film RM1 in order to pre-tilt the liquid crystal molecules LC. The upper alignment layer RM2 may be formed beneath the overcoat layer OC, and the lower alignment layer RM1 may be formed on the pixel electrode PE. The upper alignment layer RM2 and the lower alignment film RM1 may be configured such that the liquid crystal molecules are arranged in a predetermined direction on the plane on which the lower alignment layer RM1 is formed, or are arranged at an angle of 0.5° to 3° in a direction perpendicular to the plane on which the lower alignment layer RM1 is formed, in a state in which an electric field is not applied to the liquid crystal molecules LC. However, any one of the upper alignment layer RM2 and the lower alignment film RM1 may be omitted, and both of them may also be omitted. Moreover, the liquid crystal molecules may be pre-tilt due to their own physical properties, not due to the alignment layers.

The liquid crystal display can display a specific image due to the interaction of the aforementioned array substrate AS, opposite array substrate OAS, and liquid crystal layer LCL. Further, due to the structures of the aforementioned first gate line GL1, second gate line GL2, and third gate line GL2 and the arrangement thereof, a liquid crystal display having a thin bezel and minimizing the decrease in transmittance.

Figure 7:
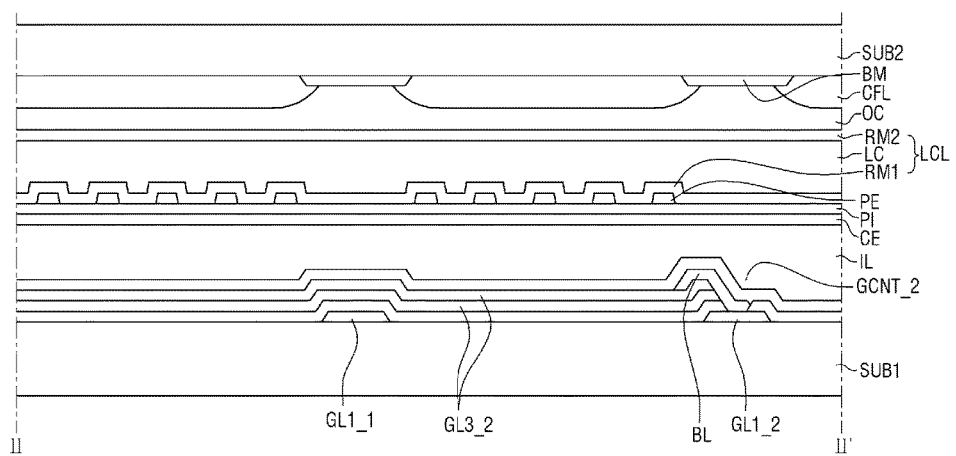
FIG. 7 is a cross-sectional view taken along the line II-II' of FIG. 4 according to an embodiment.

FIG. 7 is a cross-sectional view taken along the line II-II' of FIG. 4 according to an embodiment.

In the following embodiment, like reference numerals designate like elements having the same configuration as the matter described in advance, and the overlapping description will be omitted or simplified.

The embodiment of FIG. 7 is different from the embodiment of FIG. 6 in the structure of the gate contact hole GCNT.

In the case of the embodiment of FIG. 6, the second gate line GL2 or the third gate line GL3 is directly formed in the gate contact hole GNCT, whereas, in the case of the embodiment, a bridge line BL, which is made of a metal material, is additionally formed. Therefore, any one of the first gate line GL1, the second gate line GL 2, and the third gate line GL3 may be connected through the bridge line BL.

When the first gate line GL1 is connected with the second gate line GL2 or the third gate line GL3 without forming the second gate line GL2 and the third gate line GL3, failure, such as disconnection, in the vicinity of the gate contact hole GCNT can be minimized, durability can be improved, and resistance can be reduced.

Figure 8:
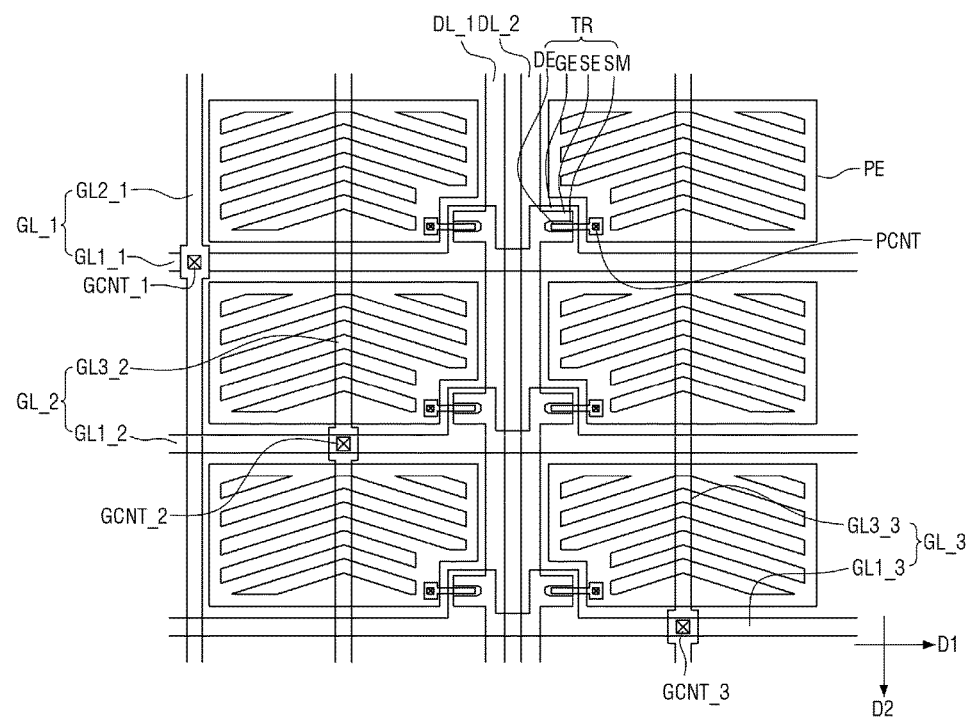
FIG. 8 is a layout view (or plan view) showing several pixels of a display panel according to an embodiment.

FIG. 8 is a layout view (or plan view) showing several pixels of a display panel according to an embodiment The embodiment of FIG. 8 is different from the embodiment of FIG. 4 in the arrangement of the second gate line GL2 and third gate line GL3.

In the case of the embodiment of FIG. 4, each of the second gate line GL2 and the third gate line GL3 extends to only the point connected with the corresponding first gate line GL1. That is, in the embodiment of FIG. 4, the primary second gate line GL2_1 extends to only the point connected with primary first gate line GL1_1, and does not overlap the secondary first gate line GL1_2. Similarly, the secondary third gate line GL3_2 extends to only the point connected with the secondary first gate line GL1_2, and does not overlap the tertiary first gate line GL1_3.

In contrast, in present embodiment, each of the second gate line GL2 and the third gate line GL3 extends to the point connected with the corresponding first gate line GL1 or over the point. Consequently, all of the second gate line GL2 and the third gate line GL3 may be formed in the same shape as each other, excluding the area in which the gate contact hole GCNT. Further, the number of the first gate line GL1 overlapping the second gate line GL2 may be equal to the number of the first gate line GL1 overlapping the third gate line GL3.

That is, the primary second gate line GL2_1 may extend to overlap both the secondary first gate line GL1_2 and the tertiary first gate line GL1_3 over the first gate contact hole GNCT_1 connected with the primary first gate line GL1_1. Similarly, the secondary third gate line GL3_2 may extend to overlap the tertiary first gate line GL1_3 over the second gate contact hole GNCT_2 connected with the secondary first gate line GL1_2.

Therefore, it is possible to ensure uniform transmittance in all the pixels PX of the display panel 10 without variation in transmittance due to the structure of the second gate line GL2 or the second gate line GL3 with respect to each pixel PX.

Figure 9:
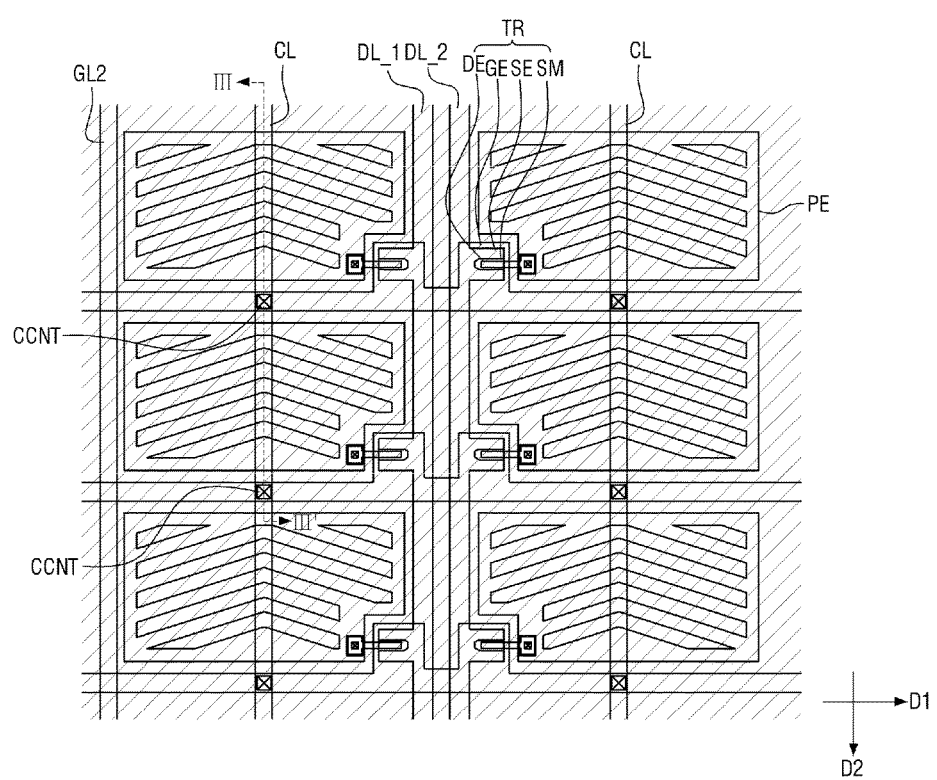
FIG. 9 is a layout view (or plan view) showing several pixels of a display panel according to an embodiment.
Figure 10:
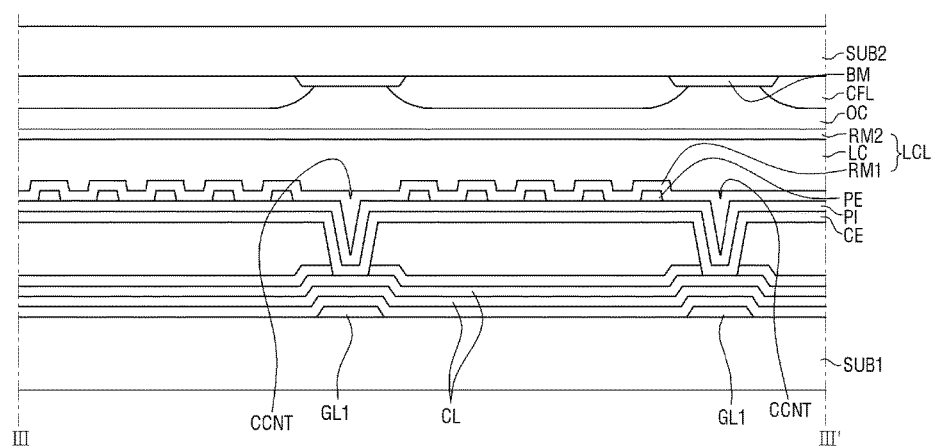
FIG. 10 is a cross-sectional view taken along the line of FIG. 9 according to an embodiment.

FIG. 9 is a layout view (or plan view) showing several pixels of a display panel according to an embodiment, and FIG. 10 is a cross-sectional view taken along the line III-III' of FIG. 9 according to an embodiment.

The embodiment of FIG. 9 is different from the embodiment of FIG. 4 in that a common electrode CE is additionally shown, and a common line is disposed at a position at which the third gate line GL3 is disposed.

Referring to FIG. 9, the common line CL may be disposed at a position at which the existing third gate line GL3 is formed. The common line CL extends along in a second direction D2. The common line CL may be formed of the same material in the same layer together with the data line DL.

However, the common line CL is not connected with the first gate line GL1, and may be connected with the common electrode CE. The common line CL may be connected with the common electrode CE through the common contact hole CCNT. The common contact hole CCNT may be formed at a position at which the common line CL intersects with the first gate line GL1. A plurality of common contact holes CCNTs may be formed along one common line CL. The common contact hole CCNT may be formed to penetrate the passivation film PA and the planarization film IL.

However, although the third gate line GL3 is not shown in FIG. 9, the common line CL and the third gate line GL3 may also be respectively formed in one display panel 10. As described above, the maximum allowable number of the second gate line GL2, the third gate line GL3, the data line DL, and the common line CL, which are lines extending in the second direction D2, is determined according to the number of columns of pixels PX disposed in the display panel 10. Here, the number of the second gate line GL2, the third gate line GL3, and the data line DL, which are necessary according to the number of rows of pixels PX, may be smaller than the above maximum allowable number. Therefore, the number of disposable common lines CLs may be obtained by subtracting the number of the second gate line GL2, the third gate line GL3, and the data line DL, which are necessary according to the number of rows of pixels PX, from the maximum allowable number.

The common line CL serves to minimize the resistance of the common electrode CE. Since the common electrode CE is formed over the entire surface of the display panel 10, it requires light transmitting properties. Therefore, since an opaque metal material cannot be used, a material having higher resistance than the opaque metal material can be used. The common line CL serves to minimize the resistance of such a common electrode CE.

Figure 11:
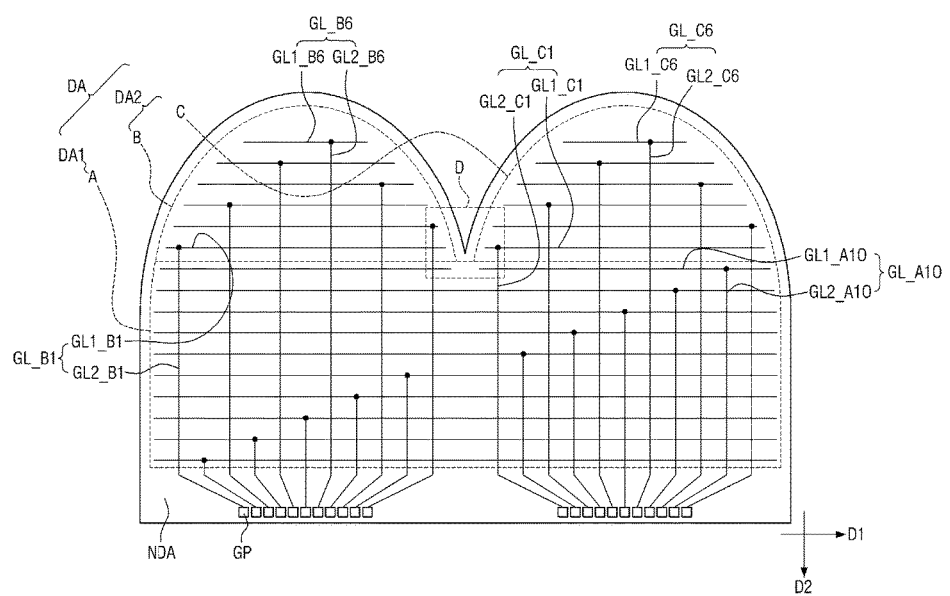
FIG. 11 is a layout view (or plan view) of a display panel according to an embodiment.
Figure 12:
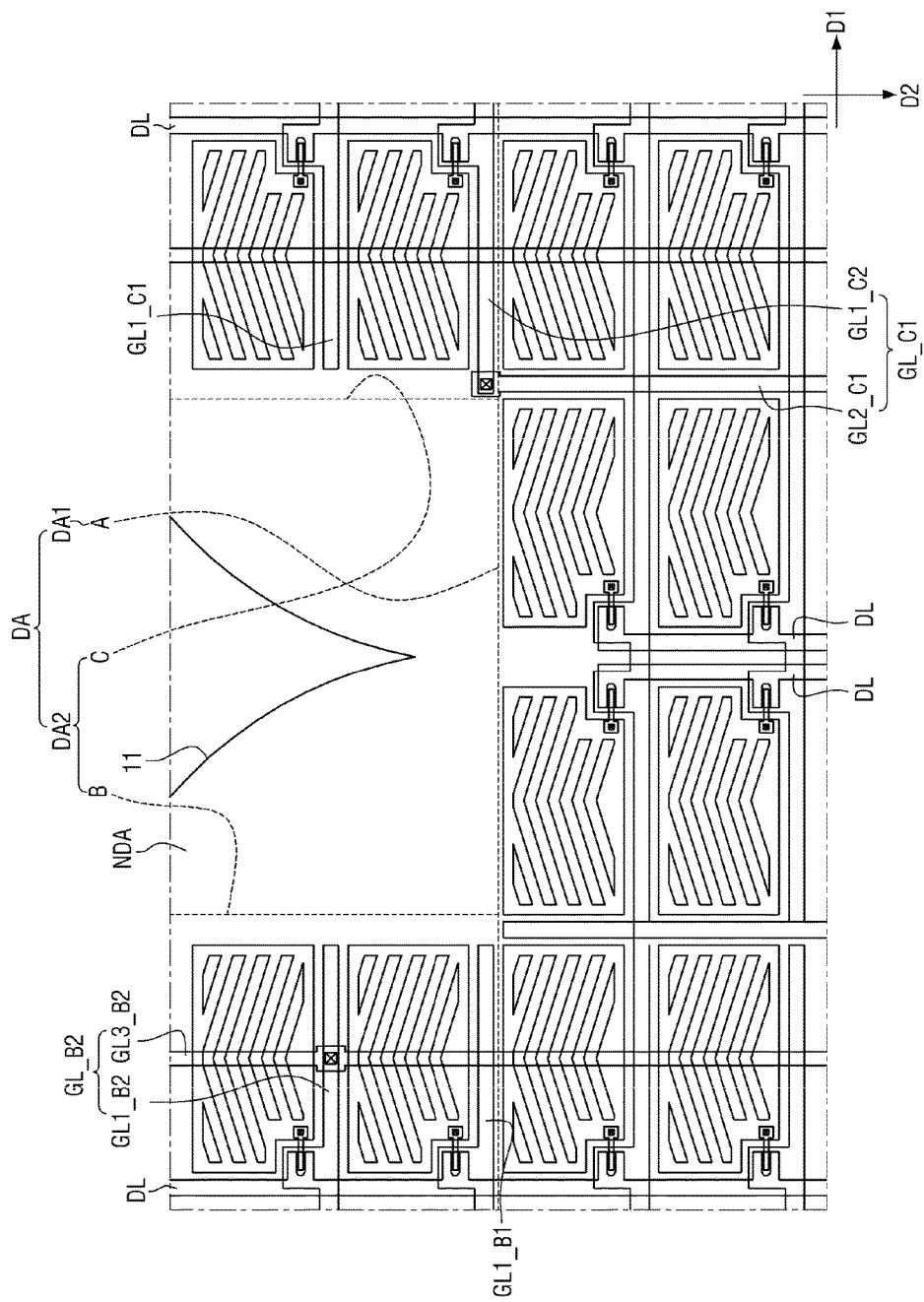
FIG. 12 is a layout view (or plan view) of an area of the display panel illustrated in FIG. 11 according to an embodiment.

FIG. 11 is a layout view (or plan view) of a display panel according to an embodiment, and FIG. 12 is a layout view (or plan view) of an area D of FIG. 11.

For the convenience of explanation, data lines DL are not shown in FIG. 11.

Referring to FIGS. 11 and 12, the display panel 10 according to another embodiment includes a display area DA and a non-display area NDA. The definitions of the display area DA and the non-display area NDA have been described as above. However, the display area DA in the display panel 10 according to present embodiment may include a plurality of areas separated from each other. That is, the display area DA may include a first display area DA1 and a second display area DA2. This first display area DA1 may be disposed to have a parallelogram shape, and the second display area DA2 may be disposed to have a shape protruding from the first display area DA1 in a second direction D2. Further, a plurality of second display areas DA2 may be formed.

In this case, the non-display area NDA may be disposed between the second display areas DA2. The plurality of second display areas DA2 may be spaced apart from each other by the non-display area NDA.

Therefore, in an embodiment, the display area DA may be divided into area A, area B, and area C. The area A corresponds to the first display area DA1, and each of the area B and area C corresponds to the second display area DA2. Two edges 11 of a substrate of the display panel 10 may be positioned between the area B and the area C.

The first display area DA1 and the second display area DA2 are different from each other in the disposition of the first gate lines GL1. That is, in the first display area DA1, one first gate line GL1 is disposed on any straight line extending in a first direction D1, whereas, in the second display area DA2, a plurality of first gate lines GL1 are disposed on any straight line extending in the first direction D1.

In the first display area DA1, the gate signals can be provided to all pixels PX disposed on the same row through one first gate line GL1. In contrast, in the second display area DA2, the gate signals cannot be provided to all pixels PX disposed on the same row through one first gate line GL1, and two or more first gate lines GL1 can be required for pixels PX of one row.

Specifically, it is exemplified in present embodiment that pixels PX of ten rows are disposed in the area A, and pixels PX of six rows are disposed in each of the area B and the area C. Here, in the area A, one first gate line GL1 can be connected with all the pixels PX of one row, and thus ten gate lines are required. In contrast, Since the area B and the area C are disconnected with each other, two first gate lines GL1 are required even though pixels PX are disposed on the same row of the area B and the area C. That is, in order to drive the pixels PX in the area B, six first gate lines GL1 are required regardless of the pixels PX in the area C. Similarly, in order to drive the pixels PX in the area C, six first gate lines GL1 are required regardless of the pixels PX in the area B.

Consequently, in present embodiment, although pixels PX are disposed over a total of 16 rows in the display area DA, 22 first gate lines GL1 are required in order to drive these pixels PX. That is, a large number of the first gate lines GL1 are required compared to the number of rows of pixels PX. Further, since the first gate line GL1 is one to one correspond to any one of the second gate line GL2 and the third gate line GL3, the total number of the second gate line GL2 and the third gate line GL3 is required to be 22.

Nevertheless, as described above, if, based on pixels PX of two columns, one second gate line GL2 is disposed at the left side of the pixels PX of the first column, one third gate line GL3 is disposed to overlap the pixels PX of the first column, two data lines DL are disposed between the pixels PX of the first column and the pixels PX of the second column, and one third gate line GL3 is disposed to overlap the pixels PX of the second column, the disposition of the second gate line GL2, the gate line GL3, and the data line DL corresponding to 2.5 times the number of columns can be allowed. Therefore, even though the number of the first gate lines GL1 required for the second display area DA2 increases, and thus the number of the second gate lines GL2 and the third gate lines GL3 also increases, such a configuration can be sufficiently designed to allow the gate driving unit 100 and the data driving unit 200 to be disposed at only one side edge of the display panel 10.

For example, it is assumed that the display panel 10 has a resolution of 1920×720. In this case, the unit pixel PX, which is basis for the resolution, may be composed of three pixels of one red pixel PX, one green pixel PX, and one blue pixel PX. Since these three pixels PX can be continuously disposed in the second direction D2, the display panel 10 may include pixels PX disposed in the form of a matrix of 1920 rows and 2160 columns. Therefore, in order to drive the display panel 10, 1920 data lines DL and 2160 first gate lines GL1 are required. Moreover, when the display panel includes a first display area DA1 having a resolution of 1920×500 and a second display area DA2 having a resolution of 1920×220, pixels PX are disposed over 1920 rows and 1500 columns in the first area DA1, and pixels PX are disposed over 1920 rows and 1500 columns in the second area DA2.

In this case, when the first display area DA1 and the second display area DA2 are applied as shown in FIG. 11, the first display area DA1 and the second display area DA2 can share the data lines DL extending in the second direction, and thus there is no problem in the arrangement of the data lines DL.

However, in the case of the gate line GL, in the second display area DA2, 1320 first gate lines GL1 are required in order to drive the pixels PX disposed over 660 columns, and the total number of the second gate lines GL2 and the third gate lines GL3 is required to be 1320. Consequently, in order to drive the pixels PX disposed over 1920 rows and 2160 columns in the display area, 1920 data lines DL, 2820 first gate lines GL1, and 2820 second gate lines GL2 or third gate lines GL3 are required.

Nevertheless, since the maximum allowable number of the sum of data lines DL, second gate lines GL2, and third gate lines GL3, which are disposed in the direction D2, is 4800, which is 2.5 times of 1920 pixel columns, when 1920, which is the number of data lines DL, is subtracted from 4800, the number of second gate lines GL2 or third gate lines GL3 can be allowed up to 2880.

Therefore, in an embodiment, the number of second gate lines GL2, third gate lines GL3, and first gate lines GL1 is 2820, which is less than 2880.

When both the gate driving unit 100 and the data driving unit 200 are mounted at one edge of the display panel 10 using first gate lines GL1, second gate lines GL2, and third gate lines GL3, both the gate signal and the data signal can be provided from one edge of the display panel 10, and thus it is possible to minimize the limitation in the appearance of the display panel 10 and the display area DA.

According to embodiments, In a display device, e.g., a liquid crystal display, gate driving units and a data driving units may be disposed at a same edge of a substrate without being disposed at multiple edges of the substrate. Advantageously, the gate driving units and the data driving units may desirably minimize addition to the size of the display device.

According to embodiments, since gate driving units and data driving units may occupy only one edge of a display device, design of the shapes of other portions of the display device may be substantially configurable. Advantageously, the overall shape of the display device may be optimized for particular requirements.

Effects of embodiments are not limited by the foregoing, and other various effects are possible.

Although t embodiments have been disclosed for illustrative purposes, those skilled in the art will appreciate that various modifications, additions and substitutions are possible, without departing from the scope and spirit defined in the accompanying claims.

What is claimed is:

1. A display device comprising:
   a first pixel electrode;
   a first transistor, which is electrically connected to the first pixel electrode;
   a first gate line, which is electrically connected to a gate electrode of the first transistor;
   a second gate line, which extends not parallel to the first gate line; and
   a third gate line, which overlaps the first pixel electrode and extends not parallel to the first gate line, wherein the second gate line is directly connected to the first gate line, and wherein the first pixel electrode is partially positioned between the second gate line and the third gate line in a plan view of the display device.

2. The display device of claim 1, wherein the third gate line is straight and crosses the first gate line in the plan view of the display device.

3. The display device of claim 1 comprising:
   an insulating film, which is positioned between the first gate line and the second gate line, is positioned between the first gate line and the third gate line, and has a first surface and a second surface opposite each other, wherein the first surface of the insulating film directly contacts each of the second gate line and the third gate line, and wherein the second surface of the insulating film directly contacts the first gate line; and
   a data line, which is electrically connected to a source electrode of the first transistor, directly contacts the first surface of the insulating film, and is formed of a conductive material, wherein each of the second gate line and the third gate line is formed of the conductive material.

4. The display device of claim 1, wherein the second gate line is electrically connected to the first gate line, and wherein the third gate line is electrically insulated from the first gate line.

5. The display device of claim 1, wherein the first pixel electrode comprises a first electrode portion and a second electrode portion, wherein the first electrode portion is positioned between the second gate line and the third gate line in the plan view of the display device, wherein the third gate line is positioned between the first electrode portion and the second electrode portion in the plan view of the display device, and wherein the first electrode portion extends at an obtuse angle with respect to the second electrode portion.

6. The display device of claim 5, wherein the first electrode portion and the second electrode portion are symmetrical to each other with reference to the third gate line in the plan view of the display device.

7. The display device of claim 1 comprising:
a second pixel electrode;
a second transistor, which is electrically connected to the second pixel electrode;
a fourth gate line, which is electrically connected to a gate electrode of the second transistor;
a fifth gate line, which extends not parallel to the fourth gate line;
a sixth gate line, which overlaps the second pixel electrode and extends not parallel to the fourth gate line, wherein the fifth gate line or the sixth gate line is electrically connected to the fourth gate line, and wherein the second pixel electrode is partially positioned between the fifth gate line and the sixth gate line in the plan view of the display device; and
a non-display area, which is positioned between the first pixel electrode and the second pixel electrode in the plan view of the display device and is wider than each of the first pixel electrode and the second pixel electrode in a direction parallel to the first gate line.

8. The display device of claim 7 comprising: a substrate, which overlaps both the first pixel electrode and the second pixel electrode and has two edges, wherein the two edges of the substrate are positioned between the first pixel electrode and the second pixel electrode in the plan view of the display device.

9. The display device of claim 8, wherein each of the two edges of the substrate is curved.

10. The display device of claim 8, wherein one of the two edges extends at an acute angle with respect to another of the two edges in the plan view of the display device.

11. The display device of claim 8, wherein the first gate line is aligned with the fourth gate line and is spaced from the fourth gate line, and wherein the two edges of the substrate are positioned between the first gate line and the fourth gate line in the plan view of the display device.

12. The display device of claim 7, wherein the first gate line is aligned with the fourth gate line and is spaced from the fourth gate line, and wherein the non-display area is positioned between the first gate line and the fourth gate line in the plan view of the display device.

13. The display device of claim 7, wherein the second gate line is electrically insulated from the first gate line, wherein the third gate line is electrically connected to the first gate line, wherein the fifth gate line is electrically connected to the fourth gate line, wherein the sixth gate line is electrically insulated from the fourth gate line, and wherein the third gate line and the sixth gate line are positioned between the second gate line and the fifth gate line in the plan view of the display device.

14. The display device of claim 1 comprising:
a second pixel electrode, which overlaps the third gate line;
a second transistor, which is electrically connected to the second pixel electrode; and
a fourth gate line, which is electrically connected to a gate electrode of the second transistor, is electrically insulated from the third gate line, and extends parallel to and longer than the first gate line.

15. The display device of claim 1 comprising: a gate driving chip, which is electrically connected through the second gate line or the third gate line to the first gate line, wherein the first pixel electrode is positioned between the first gate line and the gate driving chip.

16. The display device of claim 15 comprising: a substrate, which comprises a display area and a non-display area, wherein the display area overlaps the first pixel electrode, and wherein a boundary between the display area and the non-display area extends parallel to the first gate line and is positioned between the first pixel electrode and the gate driving chip.

17. The display device of claim 16 comprising:
a data line, which is electrically connected to a source electrode of the first transistor; and
a data driving chip, which is electrically connected to the data line, wherein the first pixel electrode is positioned between the first gate line and the data driving chip, and wherein the boundary is positioned between the first pixel electrode and each of the data driving chip and the gate driving chip.

18. The display device of claim 15 comprising:
a data line, which is electrically connected to a source electrode of the first transistor; and
a data driving chip, which is electrically connected to the data line and is aligned with the gate driving chip in a direction parallel to the first gate line.

19. The display device of claim 1 comprising:
a second pixel electrode;
a second transistor, which is electrically connected to the second pixel electrode and is electrically connected to the first gate line;
a common voltage line, which overlaps the second pixel electrode; and
a common electrode, which overlaps both the first pixel electrode and the second pixel electrode and extends through a contact hole to directly contact the common voltage line, wherein the contact hole is positioned at an intersection of the common voltage line and the first gate line in the plan view of the display device.

20. The display device of claim 1 comprising:
a second pixel electrode;
a second transistor, which is electrically connected to the second pixel electrode and is electrically connected to the first gate line;
a common voltage line, which overlaps the second pixel electrode;
a common electrode, which overlaps both the first pixel electrode and the second pixel electrode and extends through a contact hole to directly contact the common voltage line; and
an insulating film, which is positioned between the first gate line and the second gate line, is positioned between the first gate line and the third gate line, is positioned between the first gate line and the common voltage line, and has a first surface and a second surface opposite each other, wherein the first surface of the first insulating film directly contacts each of the second gate line, the third gate line, and the common voltage line, and wherein the second surface of the first insulating film directly contacts the first gate line.

\* \* \* \* \*